United States Patent [19]
Yamanashi

[11] Patent Number: 5,621,328
[45] Date of Patent: Apr. 15, 1997

[54] CONNECTOR HAVING A SPACER DETECTION STRUCTURE

[75] Inventor: Makoto Yamanashi, Shizoka-ken, Japan

[73] Assignee: Yazaki Corporation, Tokyo, Japan

[21] Appl. No.: 498,927

[22] Filed: Jul. 6, 1995

[30] Foreign Application Priority Data

Jul. 11, 1994 [JP] Japan ..................... 6-158449

[51] Int. Cl.$^6$ ........................... G01R 31/04; H01R 13/73
[52] U.S. Cl. ..................... 324/538; 324/555; 439/488; 439/552; 439/559
[58] Field of Search ................... 324/538, 555; 439/488, 351, 549, 550, 552, 557, 559, 588, 752

[56] References Cited

U.S. PATENT DOCUMENTS

| | | | |
|---|---|---|---|
| 4,849,743 | 7/1989 | Ohno | 324/538 X |
| 4,902,968 | 2/1990 | Sugimoto | 324/538 X |
| 5,279,507 | 1/1994 | Kameyama et al. | 439/552 |
| 5,335,413 | 8/1994 | Yamamoto et al. | 324/538 X |
| 5,455,515 | 10/1995 | Saijo et al. | 324/538 |
| 5,487,680 | 1/1996 | Yamanashi | 439/552 |

FOREIGN PATENT DOCUMENTS 7-65909  3/1995  Japan .

*Primary Examiner*—Kenneth A. Wieder
*Assistant Examiner*—Diep Do
*Attorney, Agent, or Firm*—Finnegan, Henderson, Farabow, Garrett & Dunner, L.L.P.

[57] ABSTRACT

In a spacer detection structure of a connector having: an oval connector housing (2); a plurality of connector terminals (32) housed in the connector housing; and a terminal fixing spacer (4) engaged with the connector terminals when the connector terminals are fully inserted into the connector housing and formed with a curved base wall portion (5) along an oval shape of the connector housing, the curved base wall portion (5) of the terminal fixing spacer (4) is formed with a recessed portion (10) having a flat bottom surface (9) brought into contact with at least one detection plate (8) of a connector fixing jig (7) for inspecting whether the terminal fixing spacer is full inserted into the connector housing. Therefore, it is possible to securely inspect an imperfect insertion of the oval terminal fixing spacer (4) into the oval connector housing (2), without increasing the manufacturing cost of the connector fixing jig (7) of the inspection instrument.

3 Claims, 4 Drawing Sheets

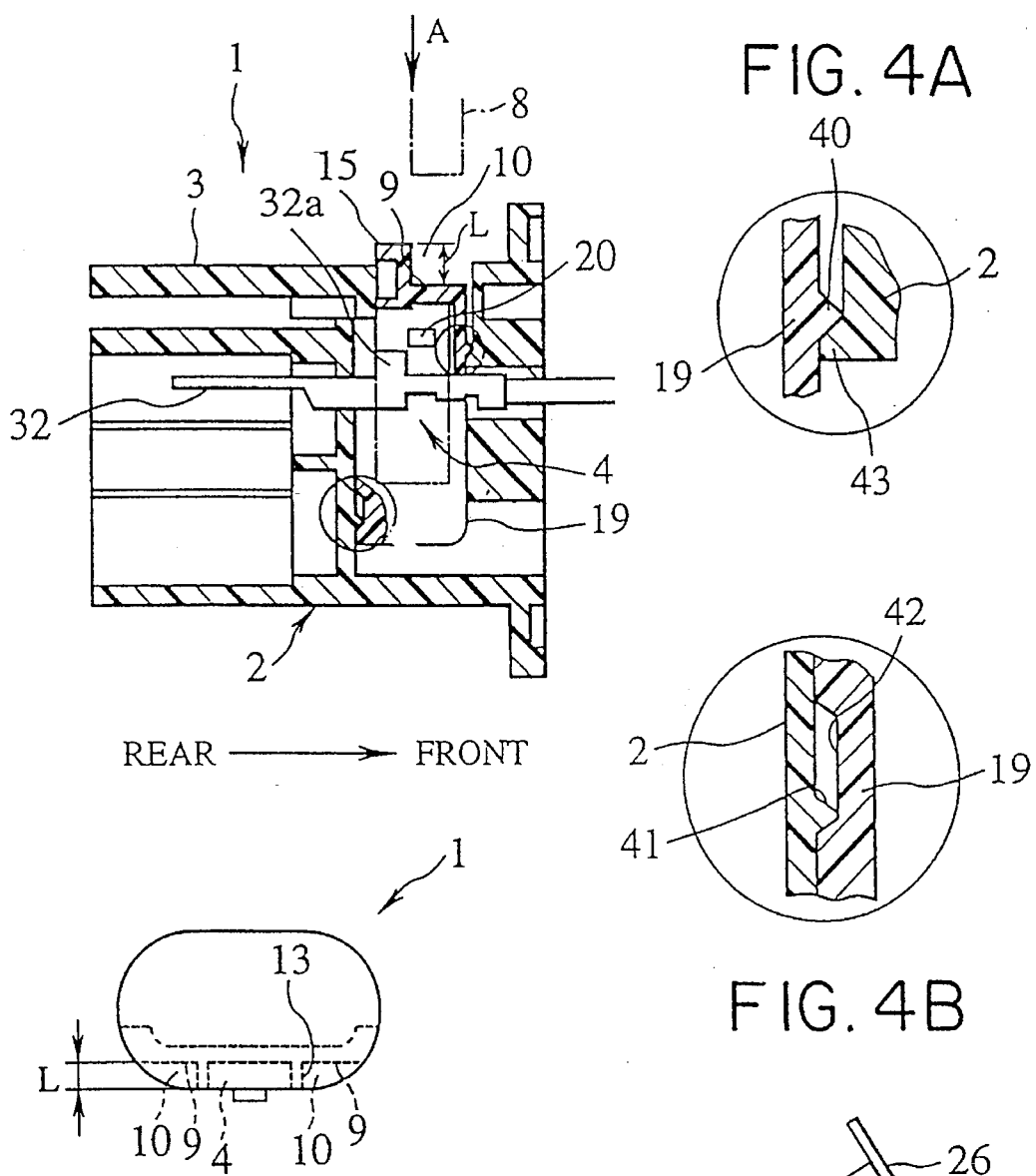
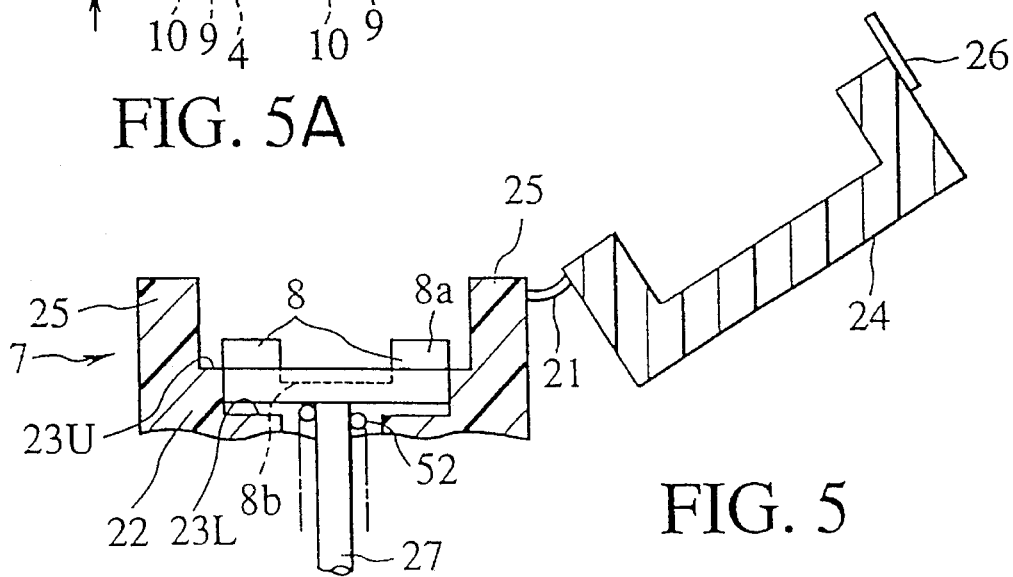

CONNECTOR HAVING A SPACER DETECTION STRUCTURE

BACKGROUND OF THE INVENTION

1. Technical Field

The present invention relates to a spacer detection structure for a connector, and more specifically to a spacer detection structure of a connector by which an imperfect insertion of a curved (e.g., oval) spacer into a curved (e.g., oval) connector housing having a curved (e.g., oval) rubber grommet, for instance can be securely inspected by use of an inspection instrument. Here, the spacer is used to firmly fix connector terminals housed in the connector housing of the connector.

2. Description of the Related Art

In the connector having a curved spacer used to securely fix a plurality of connector terminals arranged in a curved connector housing, it is necessary to inspect an imperfect insertion of the curved terminal fixing spacer into the curved connector housing, that is, whether the terminal fixing spacer has been full inserted into the connector housing so as to fix the connector terminals firmly within the connector housing, with the use of an appropriate inspection instrument. In the conventional spacer detection structure of a connector, however, since the outer surface of the terminal fixing spacer is formed into a curved shape at the four corners thereof (as when the connector housing is oval in cross section), there exists a problem in that some additional gaps are inevitably formed between the outer surface of the terminal fixing spacer and the connector fixing jig of the inspection instrument, so that it is impossible to reliably inspect an imperfect insertion of the curved terminal fixing spacer into the curved connector housing by the inspection instrument.

To overcome this problem, it may be possible to form the outer surface of the connector fixing jig of the inspection instrument into a curved shape so as be well fitted to the outer curved surface of the terminal fixing spacer. In this method, however, there arises another problem in that it is difficult to form the connector fixing jig into a curved shape according to the outer curved surface of the terminal fixing spacer. Even if possible, a number of manufacturing process are needed and therefore the connector fixing jig becomes costly.

SUMMARY OF THE INVENTION

With these problems in mind, therefore, it is the object of the present invention to provide a spacer detection structure for a connector, by which an imperfect insertion of the curved terminal fixing spacer into the curved connector housing can be inspected firmly with the use of an ordinary connector fixing jig of an inspection instrument, without increasing the manufacturing cost of the connector fixing jig thereof.

To achieve the above-mentioned object, the present invention provides a spacer detection structure of a connector having: a curved connector housing (2); a plurality of connector terminals (32) housed in the connector housing; and a terminal fixing spacer (4) engaged with the connector terminals when the connector terminals are fully inserted into the connector housing and formed with a curved base wall portion (5) along a curved shape of the connector housing, wherein the curved base wall portion (5) of the terminal fixing spacer (4) is formed with at least one recessed portion (10) having a flat bottom surface (9) brought into contact with a detection plate (8) of a connector fixing jig (7) for inspecting whether the terminal fixing spacer is full inserted into the connector housing.

Further, when the terminal fixing spacer (4) is formed with a central flexible lock piece (11) locked with a connector locking panel (16) to which the connector is fixed, the curved base wall portion (5) of the terminal fixing spacer (4) is formed with a pair of the recessed portions (10) each having a flat bottom surface (9) brought into contact with each of two projections (8a) of the detection plate (8) of the connector fixing jig (7), on both sides of the central flexible lock piece (11).

Here, the curved connector housing is an oval connector housing in cross section.

In the terminal fixing spacer detection structure of a connector according to the present invention, when an imperfect insertion of the terminal fixing spacer into the connector housing is detected by use of the inspection instrument, since the base wall portion of the curved (e.g., oval) terminal fixing spacer can be smoothly brought into contact with the flat detection plate of the connector fixing jig of the inspection instrument over the longitudinal direction of the curved terminal fixing spacer, it is possible to securely detect an imperfect insertion of the terminal fixing spacer into the connector housing, without increasing the manufacturing cost of the connector fixing jig can be manufactured at a low cost.

In particular, when the flexible lock pieces are formed in the connector housing, since the both partition wall surfaces formed on both sides of the flexible lock piece can be brought into contact with the end surfaces of the two flat projections of the detection plate firmly and uniformly, it is possible to more securely inspect an imperfect insertion of the terminal fixing spacer into the connector housing, without being subjected to the influence of the oval shape on both end sides of the base wall portion of the terminal fixing spacer of the connector.

BRIEF DESCRIPTION OF THE DRAWINGS

FIG. 4 is a longitudinal cross-sectional view of the connector shown in FIG. 3;

FIGS. 4A and 4B are enlarged views of portions of FIG. 4, respectively, depicting engagement of the terminal fixing spacer.

FIG. 5 is a cross-sectional view showing a connector fixing jig used for a spacer inspection instrument; and FIG. 5A is an enlarged view depicting the depth of the recessed portion formed in the terminal fixing spacer.

DETAILED DESCRIPTION OF THE EMBODIMENTS

Figure 6:
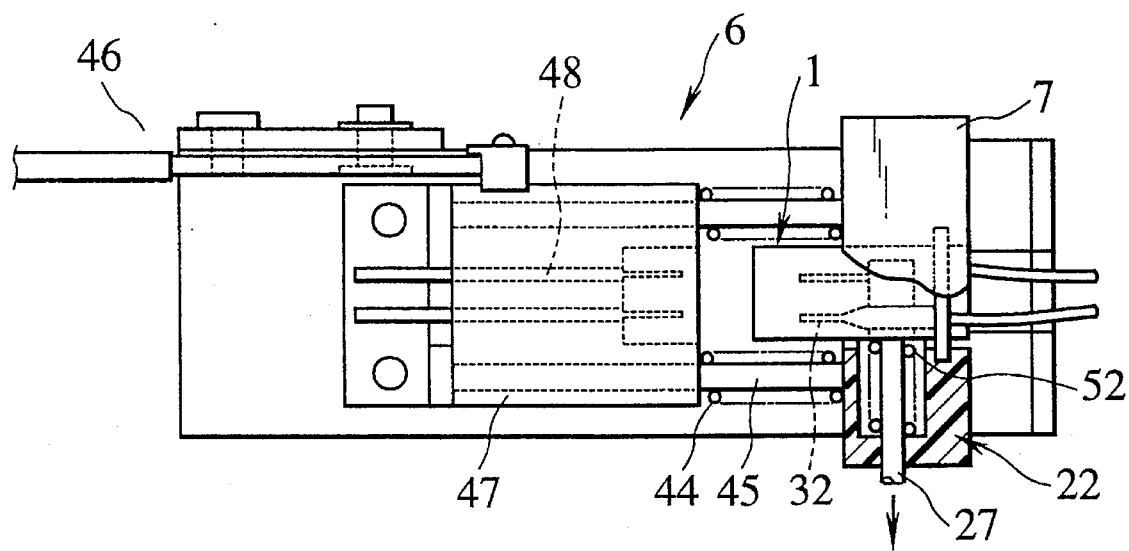
FIG. 6 is a plane, partially broken view showing the spacer inspection instrument, to which the connector according to the present invention is fitted.

An embodiment of the spacer inspection structure of a connector according to the present invention will be described hereinbelow with reference to the attached drawings. FIGS. 1 to 4 show the connector according to the present invention, FIG. 5 shows a connector fixing jig, and FIG. 6 shows a connector inspection instrument.

Figure 1:
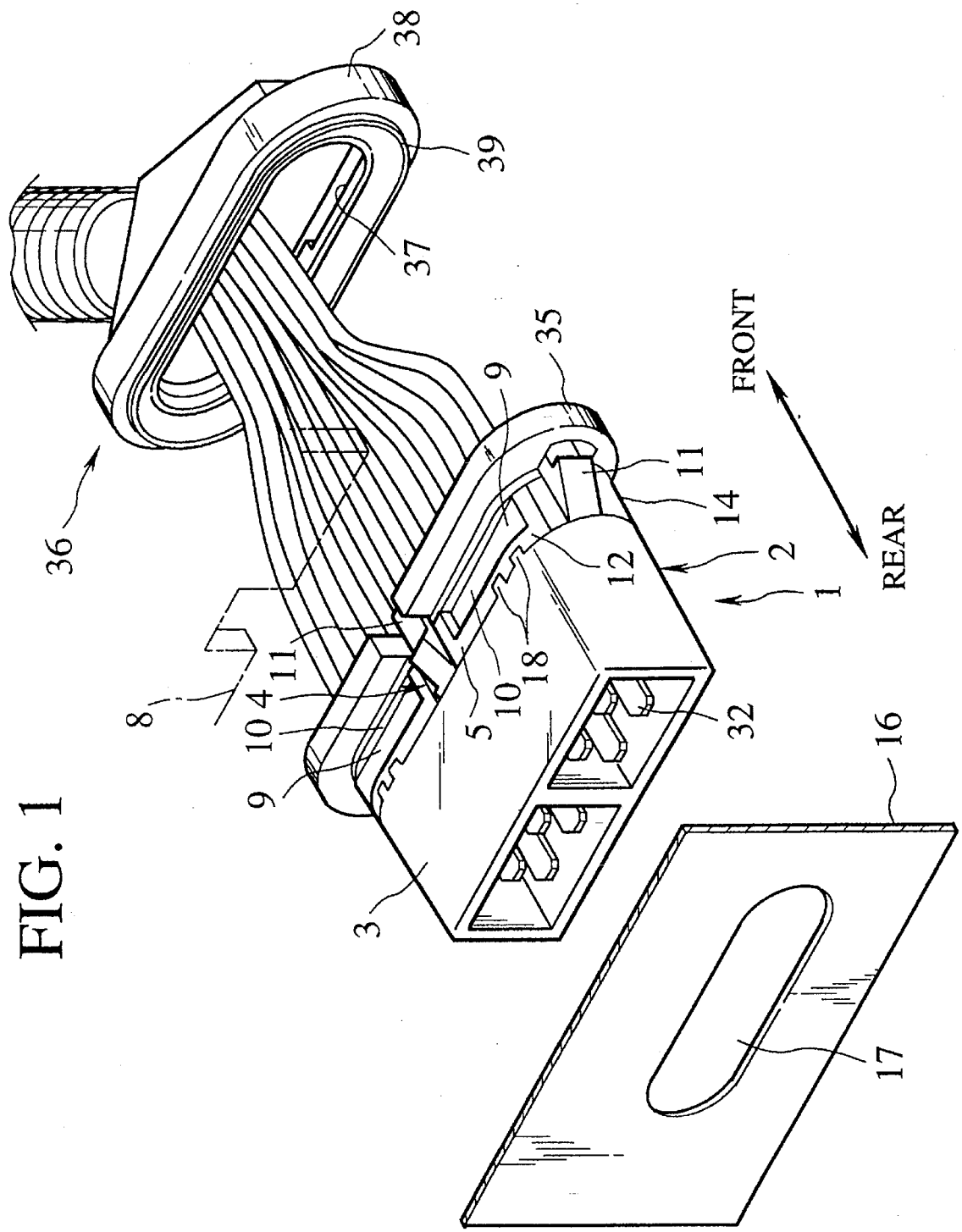
FIG. 1 is a perspective view showing an embodiment of the spacer detection structure of a curved connector according to the present invention.

In FIG. 1, a connector 1 is composed of a resin curved connector housing 2, a plurality of connector terminals 32, and an oval terminal fixing spacer 4 inserted into the connector housing 2 from the side of an upper wall 3 of the connector housing 2. The terminal fixing spacer 4 is used to fix the connector terminals in the connector housing 2 (as explained later with reference to FIG. 4).

The feature of the present invention is that the terminal fixing spacer 4 is formed with a pair of recessed portions 10 in a base wall portion 5 of the terminal fixing spacer 4. Each of the recessed portions 10 has a flat bottom surface 9 brought into contact with a detection plate 8 of a connector fixing jig 7 (shown in FIG. 5) of an inspection instrument 6 (shown in FIG. 6), as described in further detail hereinafter.

In more detail, the connector housing 2 is formed with an oval flange portion 35. The oval flange portion 35 is fitted to an inner circumferential groove 37 formed in a rubber grommet 36 of an oval shape. The oval grommet 36 is formed with an oval engage portion 38, and an end lip 39 of the oval engage portion 38 is water-tightly fitted to an oval insertion hole 17 formed in a door panel 16 of an automotive vehicle, for instance.

Figure 2:
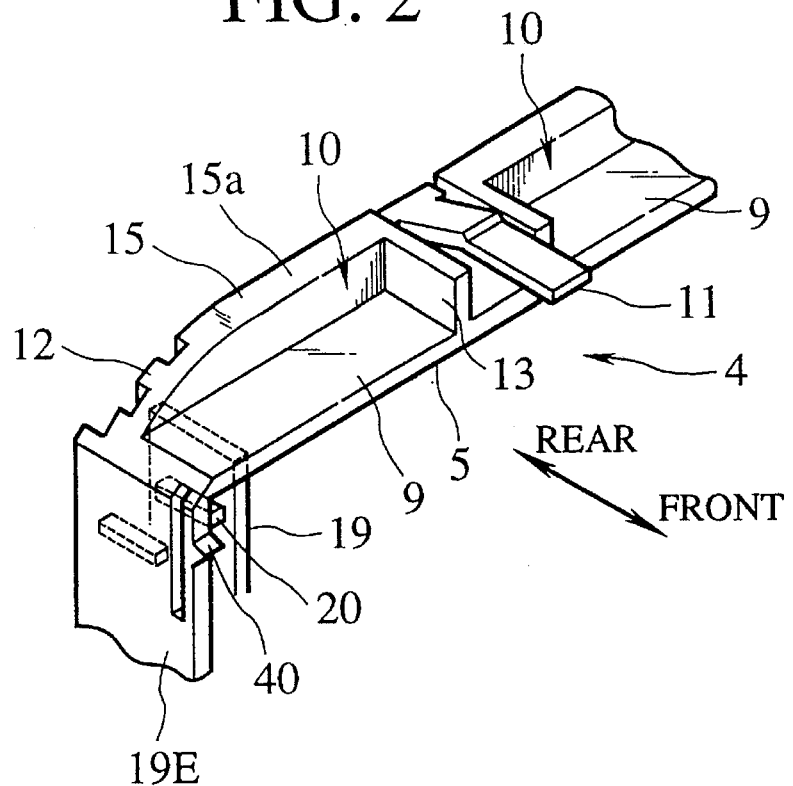
FIG. 2 is a perspective view showing an essential portion of the terminal fixing spacer according to the present invention.
Figure 3:
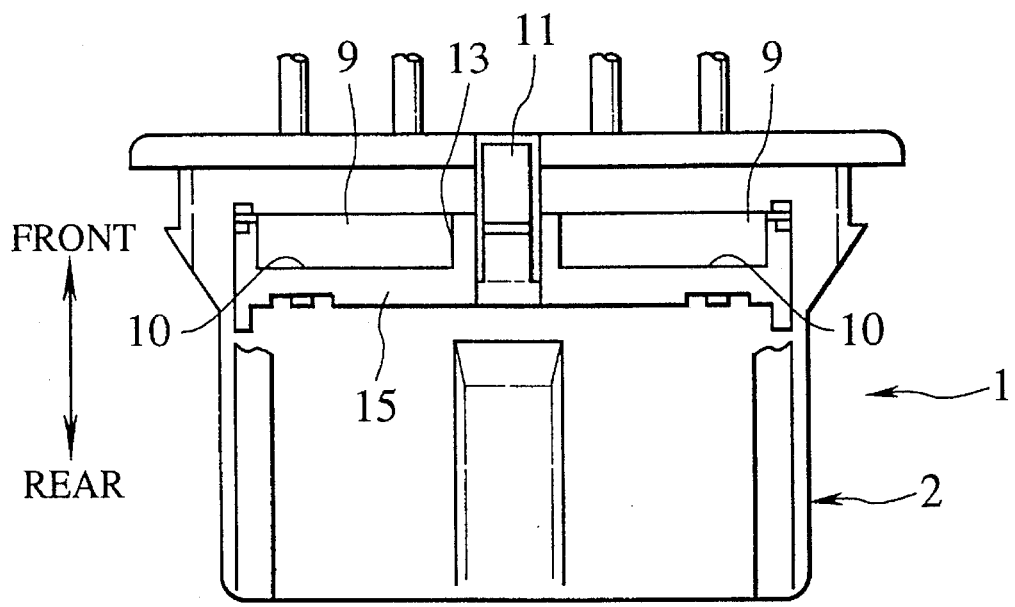
FIG. 3 is a plane view showing the spacer detection structure of the same connector according to the present invention.

As shown in FIG. 2, the terminal fixing spacer 4 is formed with a curved base wall portion 5 formed along an oval shape of the connector housing 2, a plurality of vertical comb-like plates 19 projecting inward from the base wall portion 5, and a plurality of terminal engage projections 20 each projecting outward from each vertical plate 19 in the horizontal direction. Further, each of the two vertical plates 19 formed on both outer sides of the terminal fixing spacer 4 is formed with an upper engage projection 40 engaged with a projection 43 of the connector housing 2 and with a lower engage groove 42 engaged with an engage projection 41 of the connector housing 2, as shown by an enlarged views shown in FIGS. 4A and 4B. Therefore, the terminal fixing spacer 4 is temporarily engaged with the connector housing 2, as shown in FIG. 4, when the engage projection 40 of the vertical plate 19 of the terminal fixing spacer 4 is brought into contact with the upper side of the engage projection 43 of the connector housing 2.

Under these temporal engagement conditions of the terminal fixing spacer 4 into the connector housing 2, the connector terminals 32 are inserted into and arranged within the connector housing 2. After insertion of the connector terminals 32, the base wall portion 5 of the terminal fixing spacer 4 is pushed in the downward direction as shown by A in FIG. 4. Then, since the engage projection 40 of the terminal fixing spacer 4 overrides the engage projection 43 of the connector housing 2, the terminal fixing spacer 4 can be full inserted into the connector housing 2. Under these conditions, since each of the engage projections 20 of the vertical plates 19 of the terminal fixing spacer 4 engages with each rear end portion of a stabilizer 32a of the connector terminal 32 (shown in FIG. 4), it is possible to prevent the connector terminals 32 from being removed from the connector housing 2. In this connection, since the terminal 32 is previously engaged with the housing 2 with a flexible engage lance (not shown), the connector terminals 32 can be engaged with or fixed to the connector housing 2 doubly.

Further, as shown in FIG. 1, four flexible lock pieces 11 are formed so as to project from the base wall portion 5 of the terminal fixing spacer 4. These four flexible lock pieces 11 are engaged with the circumference of the insertion hole 17 formed in the panel 16 when the connector 1 is attached to the panel 16.

As shown in FIG. 2, the terminal fixing spacer 4 is formed with a pair of recessed portions 10 on both sides of the central flexible lock piece 11 in such a way that each flat bottom surface 9 extends to each curved end portion 12 of the base wall portion 5 and further enclosed by a partition wall 13 formed on each outer side of the lock piece 11 and a curved rear wall 15 extending along the outer oval shape of the flange portion 35 of the connector housing 2. Further, the front and side ends of the recessed portion 10 are open and the flat bottom surfaces 9 extends in the horizontal direction. Further, when the central flexible lock piece 11 is not formed, the recessed portion 10 extends straight all over the base wall portion 5 of the terminal fixing spacer 4. An upper end surface 15a of the curved rear wall 15 of the terminal fixing spacer 4 is located being flush with upper wall 3 of the connector housing 2 when the terminal fixing spacer 4 is full inserted into the connector housing 2 as shown in FIG. 1. Further, in the full insertion of the terminal fixing spacer 4 into the connector housing 2, since the recessed portions 10 are formed, that is, since no portion projects from the upper wall 3 of the connector housing 2, it is possible to smoothly insert the connector 1 into the insertion hole 17 of the panel 16.

Further, as shown in FIG. 1, the connector housing 2 is formed with two pairs of guide projections 18, so that the vertical plates 19 of the terminal fixing spacer 4 can be guided between a pair of the guide projections 18 more securely and smoothly. Further, as shown in FIG. 2, the terminal engage projections 20 are formed on the vertical plates 19, respectively, as already explained. The outermost vertical plate 19E is formed in such a way that the width thereof is wider than that of the inner vertical plate 19.

The connector 1 to which a plurality of the connector terminals 32 are arranged are inspected with respect to the terminal conduction by use of an inspection instrument 6 as shown in FIG. 6. In this case, the connector 1 is fixed into a connector fixing jig 7, as shown in FIG. 5. At this time, an imperfect insertion of the terminal fixing spacer 4 into the connector housing 2 can be inspected with the use of the connector fixing jig 7 of the conduction inspection instrument 6.

In FIG. 5, the inspection jig 7 is formed into a box shape having a lower frame 22, two side frames 25 and an upper frame 24 connected to one of the side frame via a hinge 21. Further, the upper frame 24 can be engaged with the side frame 25 with an appropriate engage means 26 whenever the upper frame 24 is closed. The lower frame 22 is formed with a inner recess 23L. In the inner recess 23L of the lower frame 22, a detection plate 8 formed with a pair of flat projections 8a is mounted. The projection length of the flat projection 8a from the upper surface 23U of the lower frame 22 is substantially equal to the depth L of the recessed portions 10 formed in the terminal fixing spacer 4 as shown in FIG. 5A. Further, an inspection pin 27 (shown in FIGS. 5 and 6) is connected to the detection plate 8. The detection plate 8 is urged by a coil spring 52 upward, Therefore, when the imperfect insertion of the terminal fixing spacer 4 into the connector housing 2 is inspected, the connector 1 is set on the lower frame 22 by mating the two flat projections 8a of the detection plate 8 with the two recessed portions 10 of the terminal fixing spacer 4, and further the upper frame 24 is closed so that the connector 1 can be firmly held between the two upper and lower frames 24 and 22, that is, in such a way that the wall 3 of the connector housing 2 can be brought into contact with the upper surface 23U of the lower frame 22, and the two flat bottom surface 9 of the terminal fixing spacer 4 can be brought into contact with the upper surfaces of the flat projections 8a of the detection plate 8. Under these conditions, if the terminal fixing spacer 4 is inserted into the connector housing 2 imperfectly (e.g., as the temporal engagement condition) and therefore projects from the connector housing 2, since the flat surfaces 9 of the recessed portions 10 of the terminal fixing spacer 4 push the detection plate 8 in the downward direction, the detection pin 27 turns on a switch (not shown) for generating an alarm signal, so that it is possible to detect an imperfect insertion of the terminal fixing spacer 4 into the connector housing 2.

In practice, the above-mentioned imperfect insertion of the terminal fixing spacer is inspected by use of the terminal conduction inspection instrument as shown in FIG. 6. In FIG. 6, the inspection instrument 6 is composed of the connector fixing jig 7 as shown in FIG. 5, a plurality of guide shafts 45 each having a coil spring 44, a slider 47 having a plurality of inspection terminals 48, and a cam lever 46. Therefore, after the connector 1 has been fitted into the connector fixing jig 7, when the cam lever 46 is pivoted, since the slider 47 is moved toward the connector fixing jig 7, the inspection terminals 48 can be brought into contact with the terminals 32 of the connector 1 for conduction test.

As described above, in the terminal fixing spacer detection structure of a connector according to the present invention, when an imperfect insertion of the terminal fixing spacer into the connector housing is detected by use of the inspection instrument, since the base wall portion of the curved (e.g., oval) terminal fixing spacer can be smoothly brought into contact with the detection plate of the connector fixing jig of the inspection instrument over the longitudinal direction of the curved terminal fixing spacer, even if only one end of the curved portion of the base wall portion of the terminal fixing spacer is floated away from the inspection plate, it is possible to securely detect an imperfect insertion of the terminal fixing spacer into the connector housing. As a result, since it is unnecessary to form the inspection plate along the oval shape of the terminal fixing spacer, the connector fixing jig can be manufactured at a low cost.

In particular, when the flexible lock pieces are formed in the connector housing, since the both partition wall surfaces formed on both sides of the flexible lock piece can be brought into contact with the end surfaces of the two flat projections of the detection plate firmly and uniformly, it is possible to more securely inspect an imperfect insertion of the terminal fixing spacer into the connector housing, without being subjected to the influence of the oval shape on both end sides of the base wall portion of the terminal fixing spacer of the connector.

What is claimed is:

1. A connector having a spacer detection structure, said connector comprising:

a connector housing having a curved surface and an opening formed on one side of the connector housing;

a plurality of connector terminals housed in the connector housing; and a terminal fixing spacer inserted into the opening of the connector housing, the terminal fixing spacer being engageable with the connector terminals and having a curved base wall portion positioned substantially flush with the curved surface of the connector housing;

wherein the curved base wall portion of the terminal fixing spacer includes at least one recessed portion having a flat bottom surface configured to be brought into contact with a detection plate of a connector fixing jig for inspecting whether the terminal fixing spacer is full inserted into the connector housing.

2. The connector of claim 1, wherein the terminal fixing spacer further includes a central flexible lock piece configured to engage a connector locking panel to which the connector is fixed.

3. The connector of claim 1, wherein the connector housing has a substantially oval cross-section.

\* \* \* \* \*